United States Patent
Koyama et al.

(10) Patent No.: US 6,727,646 B1
(45) Date of Patent: Apr. 27, 2004

(54) LIGHT-EMITTING DEVICE

(75) Inventors: Tomoko Koyama, Suwa (JP); Takeo Kaneko, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/531,330

(22) Filed: Mar. 20, 2000

(30) Foreign Application Priority Data

Mar. 23, 1999 (JP) .......................................... 11-077869

(51) Int. Cl.⁷ ................................................. H01J 1/62
(52) U.S. Cl. ........................ 313/506; 313/504; 428/917
(58) Field of Search ................... 313/506, 507, 313/509, 508, 504, 501, 112; 346/161; 428/690, 917; 315/169.3; 345/45, 76

(56) References Cited

U.S. PATENT DOCUMENTS

| | | | |
|---|---|---|---|
| 4,980,895 A | 12/1990 | Nishimura | |
| 5,452,318 A | 9/1995 | Makino et al. | |
| 5,673,284 A | 9/1997 | Congdon et al. | |
| 5,784,400 A | 7/1998 | Joannopoulos et al. | |
| 5,804,919 A | * 9/1998 | Jacobsen et al. | 313/506 |

FOREIGN PATENT DOCUMENTS

| | | |
|---|---|---|
| EP | 0 878 883 A1 | 11/1998 |
| JP | 58158989 | 9/1983 |
| JP | A-1-221741 | 9/1989 |
| JP | A-2-51101 | 2/1990 |
| JP | A-2-135359 | 5/1990 |
| JP | A-2-135361 | 5/1990 |
| JP | A-3-152184 | 6/1991 |
| JP | A-5-32523 | 2/1993 |
| JP | A-5-39480 | 2/1993 |
| JP | A-5-273427 | 10/1993 |
| JP | A-5-297202 | 11/1993 |
| JP | A-6-201907 | 7/1994 |
| JP | A-6-224115 | 8/1994 |
| JP | A-7-20637 | 1/1995 |
| JP | A-7-181689 | 7/1995 |
| JP | A-7-235075 | 9/1995 |
| JP | A-8-15506 | 1/1996 |
| JP | A-8-248276 | 9/1996 |
| JP | A-9-178901 | 7/1997 |

(List continued on next page.)

OTHER PUBLICATIONS

M. Berggren et al., Organic Lasers Based on Lithographically Defined Photonic–Bandgap Resonators, "Electronic Letters", Jan. 8, 1998, pp. 90–91.

(List continued on next page.)

*Primary Examiner*—Ashok Patel
(74) *Attorney, Agent, or Firm*—Oliff & Berridge, PLC

(57) ABSTRACT

The light-emitting device has a substrate, an anode, an organic light-emitting layer, a cathode, a first and second gratings (optical sections). The first grating has a one-dimensional periodic refractive index distribution in the X direction and is capable of forming a photonic band gap. The second grating has a one-dimensional periodic refractive index distribution in the Y direction and is capable of forming a photonic band gap. A defect section is provided either for the first or second grating. This defect section is designed so that the energy level caused by the defect in within a prescribed emission spectrum. The organic light-emitting layer can emit light by electrically pumping, and an electric field is produced by the anode and cathode. The light-emitting device utilizes a two-dimensional photonic band gap and produces light with an extremely narrow spectral width at very high efficiency.

11 Claims, 9 Drawing Sheets

FOREIGN PATENT DOCUMENTS

| | | |
|---|---|---|
| JP | A-9-211728 | 8/1997 |
| JP | A-9-232669 | 9/1997 |
| JP | A-9-311238 | 12/1997 |
| JP | A-10-8300 | 1/1998 |
| JP | A-10-26702 | 1/1998 |
| JP | A-10-59743 | 3/1998 |
| JP | A-63-70257 | 3/1998 |
| JP | A-10-153967 | 6/1998 |
| JP | A-63-175860 | 7/1998 |
| JP | A-10-279439 | 10/1998 |
| JP | 10-284806 A | 10/1998 |
| JP | 2000-35504 | 2/2000 |
| WO | WO 98/50989 | 11/1998 |
| WO | WO 99/35721 | 7/1999 |

OTHER PUBLICATIONS

Stanley R. P. et al., Impurity Modes in One–Dimensional Periodic Systems: The Transition From Photonice Band Gaps to Microcavities, "Physical Review, A. General", vol. 48, No. 3, Sep. 1993.

Hiryama et al. Novel Radiation Pattern of Spontaneous Emission From Photonic Bandgap Crystal Cavity Laser, International Conference on Solid State Devices and Materials, Jan. 1, 1996 pp 220–222.

Robert D. Meade et al., Novel Applications of Photonic Band Gap Materials: Low–Loss Bends and High Q Cavities, "Journal of Applies Physics" vol. 75, No. 9, May 1, 1994 pps 4753–4755.

S. V. Frolov et al. Cylindrical Microlasers and Light Emitting Devices From Conducting Polymers " Applied Physics Letters" vol. 72, No. 22, Jun. 1, 1998.

Hirayama et al., "Novel spontaneous emission control using 3–dimensional photonic bandgap crystal cavity", Material Science and Engineering B, Elsevier Sequoia, Lausanne, CH, vol. 51, No. 1–3, Feb. 27, 1998, pp. 99–102, XP004129542.

N. Nakamura, *Cw Operation of Distributed–Feedback GaAs–GaAlAs Diode Lasers at Temperatures up to 300K*, Applied Physics Letters, vol. 27, No. 7, pp. 176–177, Oct. 1975.

McGhee M. D. et al., *Semiconducting Polymer Distributed Feedback Lasers,* Applied Physics Letters, US, American Institute of Physics, vol. 72, No. 13, pp. 1536–1538, Mar. 1998.

S. M. Sze, *Physics of Semiconductor Devices,* John Wiley & Sons, pp. 713, 1981.

\* cited by examiner

LIGHT-EMITTING DEVICE

BACKGROUND OF THE INVENTION

1. Field of the Invention

The present invention relates to a light-emitting device using an organic light-emitting layer capable of emitting light by electrically pumping or the like and having a two-dimensional photonic band gap structure.

2. Related Art

Semiconductor light-emitting devices utilizing photonic crystals are being studied in recent years (for example, Japanese Patent Application Laid-open No. 9-232669). These types of semiconductor light-emitting devices are expected to produce a resonator which can firmly confine light within crystals and to provide coherent light at an extremely high efficiency.

However, when a semiconductor is used, a boundary area of unit medium layers (each one unit in the periodical structure) becomes irregular and is affected by impurities because in semiconductors the unit medium layers are formed by crystals. It is thus difficult to obtain a uniform periodical structure and to produce a high performance light-emitting device having superior characteristics as photonic crystals. In addition, when a semiconductor is used, there is a limitation to the combination of materials with different refractive indices.

SUMMARY OF THE INVENTION

An object of the present invention is to provide a light-emitting device which can produce light with a narrow spectrum width with remarkably high efficiency and can be manufactured from an organic light-emitting material utilizing a two-dimensional photonic band gap.

The light-emitting device as the first aspect of the present invention comprises:

an optical section having a two-dimensional periodical refractive index distribution and capable of forming a photonic band gap;

a defect section formed on part of the optical section and designed so that the energy level caused by the defect is within a prescribed emission spectrum; and an organic light-emitting layer.

The light-emitting device has an organic light-emitting layer capable of emitting light by electrically pumping or optical pumping. For example, when the electrically pumping is used, electrons and holes are injected into the organic light-emitting layer respectively from a pair of electrode layers (cathode and anode). Light is emitted when the molecules return to the ground state from the excited state by recombination of the electrons and holes in the organic light-emitting layer. At this time, light with a wavelength in the photonic band gap of the above optical section cannot be transmitted through the optical section. Only the light with a wavelength equivalent to the energy level caused by the defects can be transmitted through the optical section. Therefore, light with a very narrow emission spectrum width with inhibited spontaneous emission in two dimensions can be obtained at high efficiency by specifying the width of energy level caused by the defect.

Any materials can be used for the optical section in the present invention insofar as the materials have a two-dimensional periodical refractive index distribution and are capable of forming a photonic band gap. The optical section may have a structure such as a grating-shaped structure, a multi-layer structure, a column or other columnar-shaped structure, or combinations of these structures.

The defect section of the organic light-emitting layer and the optical section may have the following configurations.

(1) The organic light-emitting layer formed in the defect section also functions as the defect section.

(2) The organic light-emitting layer also functions as part of the defect section and as one type of medium layer of the optical section.

More particularly, the light-emitting device may have the following structure.

(A) The light-emitting device as the second aspect of the invention comprises:

a first optical section having a periodical refractive index distribution in a first direction and being capable of forming a photonic band gap;

a second optical section having a periodical refractive index distribution in a second direction which is perpendicular to a first direction, the second optical section being capable of forming a photonic band gap; and a defect section formed in at least one of the first and second optical sections and designed so that the energy level caused by the defect is within a prescribed emission spectrum; and an organic light-emitting layer.

Light with a very narrow emission spectrum width with inhibited spontaneous emission in two-dimensions can be obtained at high efficiency by the combination of the first optical section which inhibits propagation of light in a first direction (X direction) and the second optical section which inhibits propagation of light in a second direction (Y direction).

(B) The light-emitting device as the third aspect of the invention comprises:

an optical section having a periodical refractive index distribution in first and second directions and capable of forming a two-dimensional photonic band gap;

a defect section formed on the optical section and designed so that the energy level caused by the defect is within a prescribed emission spectrum; and an organic light-emitting layer, wherein the optical section includes columnar-shaped first medium layers arranged in a square lattice shape and second medium layers formed between the first medium layers.

light with a very narrow emission spectrum width with inhibited spontaneous emission in two dimensions and two-directions can be obtained at high efficiency by the columnar-shaped first medium layers arranged in a square lattice shape and second medium layers formed between the first medium layers.

(C) The light-emitting device as the fourth aspect of the invention comprises:

an optical section having a periodical refractive index distribution in first, second and third directions and capable of forming a two-dimensional photonic band gap;

a defect section formed on part of the optical section which is designed so that the energy level caused by the defect is within a prescribed emission spectrum; and an organic light-emitting layer.

light with a very narrow emission spectrum width with inhibited spontaneous emission in two dimensions and three-directions can be obtained at high efficiency by the optical section having a periodical refractive index distribution in first, second and third directions and capable of forming a two-dimensional photonic band gap, such as an optical section including columnar-shaped first medium layers arranged in a triangular lattice or a honey-comb lattice and second medium layers formed between the first medium layers.

(D) The light-emitting device as the fifth aspect of the invention comprises:

an optical section having a concentric and periodical refractive index distribution and capable of forming a two-dimensional photonic band gap;

a defect section formed on the optical section and designed so that the energy level caused by the defect is within a prescribed emission spectrum; and an organic light-emitting layer, wherein the optical section includes columnar-shaped first medium layers arranged regularly and second medium layers formed between the first medium layers.

This structure of the optical section inhibits spontaneous emission in the directions of two dimensions.

In the above described light-emitting device the organic light-emitting layer has materials which can emit light by electrically pumping and the light-emitting device may comprise a pair of electrode layers for applying an electric field to the organic light-emitting layer.

Preferably, the light-emitting device in these aspects of the invention further comprises at least one of a hole transport layer or an electron transport layer.

The use of an organic light-emitting layer has the following advantages over the case in which the photonic band gap is formed by a semiconductor. Specifically, the light-emitting device comprising the organic light-emitting layer is less affected by the irregular state and impurities of the boundary area of the light-emitting layer than the case of using semiconductors, whereby excellent characteristics from the photonic band gap can be obtained. Furthermore, in the case of forming a medium layer from an organic layer, the manufacture becomes easy and a periodic structure with an effective refractive index can be obtained, whereby superior photonic band gap characteristics can be obtained.

Some of the materials which can be used to form each section of the light-emitting device according to the present invention will be illustrated below. These materials are only some of the conventional materials. Materials other than these materials can also be used.

(Organic Light-emitting Layer)

Materials for the organic light-emitting layer are selected from conventional compounds to obtain light with a designed wavelength.

As examples of such organic compounds, aromatic diamine derivatives (TPD), oxydiazole derivatives (PBD), oxydiazole dimers (OXD-8), distyrarylene derivatives (DSA), beryllium-benzoquinolinol complex (Bebq), triphenylamine derivatives (MTDATA), rubrene, quinacridone, triazole derivatives, polyphenylene, polyalkylfluorene, polyalkylthiophene, azomethine zinc complex, polyphyrin zinc complex, benzooxazole zinc complex, and phenanthroline europium complex which are disclosed in Japanese Patent Application Laid-open No. 10-153967 can be given.

Specific examples of materials for the organic light-emitting layer include compounds disclosed in Japanese Patent Application Laid-open No. 63-70257, No. 63-175860, No. 2-135361, No. 2-135359, No. 2-152184, No. 8-248276, and No. 10-153967. These compounds can be used either individually or in combinations of two or more.

(Optical Section)

Conventional inorganic and organic materials can be used for the medium layers of optical sections.

Typical examples of inorganic materials include $TiO_2$, $TiO_2$—$SiO_2$ mixture, ZnO, $Nb_2O_5$, $Si_3N_4$, $Ta_2O_5$, $HfO_2$, and $ZrO_2$ disclosed in Japanese Patent Application Laid-open No. 5-273427.

Typical examples of organic materials include various conventional resins such as thermoplastic resins, thermosetting resins, and photocurable resins. These resins are appropriately selected depending on a method of forming layers and the like. For example, in the case of using a resin which can be cured by energy of at least either heat or light, commonly used exposure devices, baking ovens, hot plates, and the like can be utilized.

As examples of such materials, a UV-curable resin disclosed in Japanese Patent Application No. 10-279439 applied by the applicant of the present invention can be given. Acrylic resins are suitable as such UV-curable resins. UV-curable acrylic resins having excellent transparency and capable of curing in a short period of time can be produced using various commercially-available resins and photosensitizers.

As specific examples of basic components of such UV-curable acrylic resins, prepolymers, oligomers, and monomers can be given.

Examples of prepolymers or oligomers include acrylates such as epoxy acrylates, urethane acrylates, polyester acrylates, polyether acrylates, and spiroacetal-type acrylates, methacrylates such as epoxy methacrylates, urethane methacrylates, polyester methacrylates, and polyether methacrylates, and the like.

Examples of monomers include monofunctional monomers such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate, and 1,3-butanediol acrylate, bifunctional monomers such as 1,6-hexanediol diacrylate, 1,6-hexanediol dimethacrylate, neopentyl glycol diacrylate, neopentyl glycol dimethacrylate, ethylene glycol diacrylate, polyethylene glycol diacrylate, and pentaerythritol diacrylate, and polyfunctional monomers such as trimethylolpropane triacrylate, trimethylolpropane trimethacrylate, pentaerythritol triacrylate, and dipentaerythritol hexaacrylate.

Although inorganic and organic materials which form the media for optical sections are given above, when an organic light-emitting layer also functions as a medium layer, materials forming such an organic light-emitting layer can also be used as the medium layer.

(Hole Transport Layer)

As materials for the hole transport layer which is optionally formed, materials conventionally used as hole injection materials for photoconductive materials or a hole injection layer for organic light-emitting devices can be selectively used. As the materials for the hole transport layer, any organic or inorganic materials which have a function of either hole introduction or electron barrier characteristics are used. Materials disclosed in Japanese Patent Application Laid-open No. 8-248276 can be given as specific examples of such materials.

(Electron Transport Layer)

Materials for the electron transport layer which is optionally formed are only required to transport electrons injected from the cathode to the organic light-emitting layer and can be selected from conventional materials. Materials disclosed in Japanese Patent Application Laid-open No. 8-248276 can be given as specific examples of such substances.

(Electrode Layer)

As the cathode which is optionally provided, electron injectable metals, alloys, electrically conductive compounds with a small work function (for example, 4 eV or less), or mixtures thereof can be used. Materials disclosed in Japanese Patent Application Laid-open No. 8-248276 can be given as specific examples of such electrode materials.

As the anode which is optionally provided, metals, alloys, electrically conductive compounds with a large work function (for example, 4 eV or more), or mixtures thereof can be used. In the case of using optically transparent materials as the anode, transparent conductive materials such as CuI, ITO, $SnO_2$, and ZnO can be used. In the case where transparency is not necessary, metals such as gold can be used.

The properties (such as the refractive index) and shape of medium layers, as well as the pitch, number, and aspect ratio of grating and columnar-shaped parts, are appropriately adjusted so that the optical section forms photonic band gaps.

The optical section can be formed by conventional methods without specific limitations. Typical examples of such methods are given below.

(1) Lithographic Method

In this method, a positive or negative resist is irradiated with ultraviolet rays, X-rays, or the like. The resist layer is patterned by development to form an optical section. As a patterning technology using a polymethyl methacrylate resist or a novolak resin resist, for example, technologies disclosed in Japanese Patent Applications Laid-open No. 6-224115 and No. 7-20637 can be given.

As a technology of patterning polyimide by photolithography, for example, technologies disclosed in Japanese Patent Applications Laid-open No. 7-181689 and No. 1-221741 can be given. Furthermore, Japanese Patent Application Laid-open No. 10-59743 discloses a technology of forming an optical section of polymethyl methacrylate or titanium oxide on a glass substrate utilizing laser ablation.

(2) Formation of Refractive Index Distribution by Irradiation

In this method, the optical waveguide section of the optical waveguide is irradiated with light having a wavelength which produces changes in the refractive index to periodically form areas having a different refractive indices on the optical waveguide section, thereby forming an optical section. As such a method, it is preferable to form an optical section by forming a layer of polymers or polymer precursors and polymerizing part of the polymer layer by irradiation or the like to periodically form areas having a different refractive index. Such a technology is disclosed in Japanese Patent Applications Laid-open No. 9-311238, No. 9-178901, No. 8-15506, No. 5-297202, No. 5-32523, No. 5-39480, No. 9-211728, No. 10-26702, No. 10-8300, and No. 2-51101.

(3) Stamping Method

An optical section is formed by, for example, hot stamping using a thermoplastic resin (Japanese Patent Application Laid-open No. 6-201907), stamping using an UV curable resin (Japanese Patent Application No. 10-279439), or stamping using an electron-beam curable resin (Japanese Patent Application Laid-open No. 7-235075).

(4) Etching Method

A thin film is selectively patterned using lithography and etching technologies to form an optical section.

Methods of forming an optical section have been described above. In summary, the optical section consists of at least two areas, each having a different refractive index, and can be fabricated, for example, by a method of forming the two areas from two materials having a different refractive index, a method of forming the two areas from one material and modifying the material forming one of the two areas so that the two areas have a different refractive index, and the like.

Each layer of the light-emitting device can be formed by a conventional method. For example, the organic light-emitting layer is formed by a suitable film-forming method depending on the materials. A vapor deposition method, spin coating method, LB method, ink jet method, and the like can be can be given as specific examples.

DESCRIPTION OF PREFERRED EMBODIMENT OF THE INVENTION

Among the embodiments described below, the first to fourth embodiments illustrate the cases where the optical section comprises perpendicularly crossing two gratings. The fifth and sixth embodiments illustrate the case where the optical section comprises a columnar part which constitutes lattice points.

First Embodiment

Figure 1:
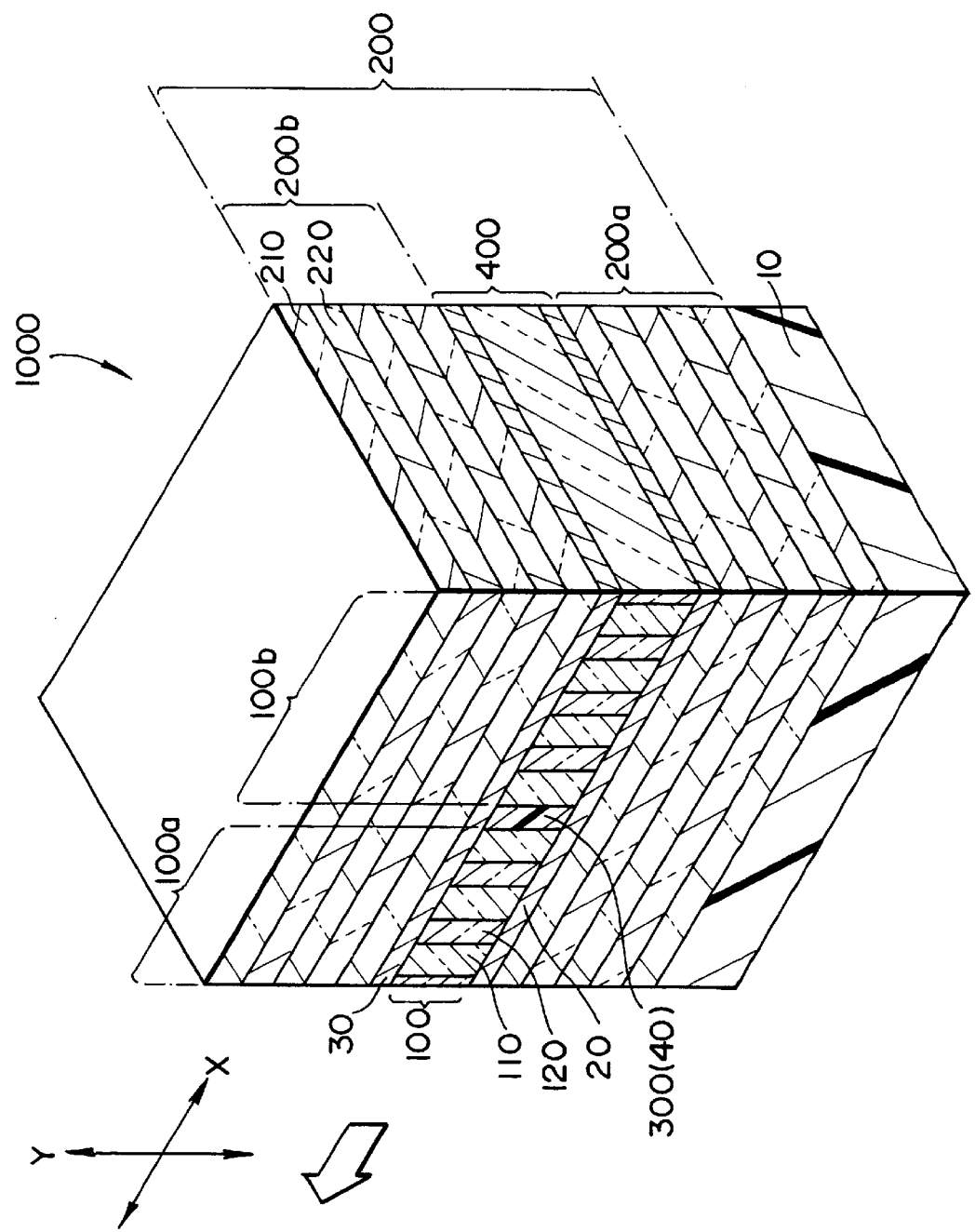
FIG. 1 is a schematic oblique view of a light-emitting device according to a first embodiment of the present invention.

FIG. 1 is an oblique view having a cross-section schematically showing a light-emitting device 1000 of the present embodiment. The light-emitting device 1000 comprises a substrate 10, an anode 20, an organic light-emitting layer 40, a cathode 30, a first optical section (grating) 100, and a second optical section (grating) 200.

The first grating 100 has a periodic refractive index distribution in a first direction (X direction) and forms a photonic band gap to a designed spectrum range, by the shape, configuration and medium combination. The second grating 200 has a periodic refractive index distribution in the Y direction which is perpendicular to the X direction and forms a photonic band gap to a designed spectrum range, by the shape, configuration and medium combination. The first grating 100 is formed in the second grating 200 in the periodical direction (the direction in which different media are periodically repeated). The second grating 200 is continuously formed above and beneath the first grating 100.

The first grating 100 comprises a first medium layer 110 and a second medium layer 120 having different refractive indices which are arranged alternately. The second grating 200 comprises a first medium layer 210 and a second medium layer 220 having different refractive indices which are arranged alternately.

Any materials can be used as the first medium layer 110, the second medium layer 120, the first medium layer 210, and the second medium layer 220 without limitation, inasmuch as these materials can form a photonic band gap by the periodic refractive index distribution. For example, a gas such as air can be used as one of the medium layers to form the first grating. When a grating is formed using a gaseous layer, commonly called an air-gap structure, the difference in the refractive indices of the two medium layers forming the grating can be enlarged with the material selection commonly used for light-emitting devices.

An anode 20 is formed below the first grating 100, and a cathode 30 is formed above the first grating 100. The anode 20 and cathode 30 are optically transparent to the emitting light. The locations of the anode 20 and cathode 30 may be reversed. This also applies to other embodiments.

The first grating 100 comprises a defect section 300 which may be formed by an organic light-emitting layer 40. Specifically, the defect section 300 of the first grating 100 also functions as the organic light-emitting layer 40 in this embodiment. The defect section 300 is formed so that the energy level caused by the defect is within the emission spectrum from the organic light-emitting layer 40 by the electrically pumping. In contrast, the photonic band gap of the second grating 200 is set so that the gap includes at least the emission spectrum from the organic light emitting layer 40 by the electrically pumping and the light emitted from the organic light-emitting layer 40 does not transfer in the second grating 200. Specifically, the laminated layer 400 which is formed by the first grating 100, an anode 20, and a cathode 30 makes up at least a pair of gratings of the second grating 200 so that the layer 400 does not function as defects for the second grating 200.

In this embodiment, the emitting light direction can be specified by providing a difference in the light confinement conditions between the two gratings which form the first grating 100*a* on the one side of the defect section 300 and the grating 100*b* on the other side of the defect section 300, which comprise the first grating 100. For example, when it is desired to cause light emitted from the left side of the defect section 300 in the X directions shown in FIG. 1, this can be accomplished by making the light confinement conditions of one grating 100*a* weaker than the light confinement conditions of the other grating 100*b*. The sufficiency of light confinement conditions in the grating can be controlled by the number of pairs of the gratings, the difference in the refractive indices of medium layers which form the optical section, and the like means, preferably by the number of pairs of the gratings. If the light confinement conditions of both the gratings 100*a* and 100*b* are maintained almost equivalent, light with almost the same power can be emitted from the both sides of the first grating 100. In the Y directions, light is confined by the gratings 200*a* and 200*b* which form the second grating 200 and are respectively arranged above or below the lamination layer 400.

Because the light is confined by the first grating 100 having a photonic band gap in the X directions and the second grating 200 having a photonic band gap in the Y directions, the light-emitting device 1000 of this embodiment can control light propagation in two-dimensions, the X and Y directions. Light with a leaky mode can be transmitted in other directions. In order to control the propagation of the light of such a leaky mode, a cladding layer or a dielectric multiple-layered mirror (which are not shown in the drawings) may be optionally formed to confine the light. This also applies to other embodiments.

The action and the effect of the light-emitting device 1000 will be described below.

Electrons and holes are injected into the organic light-emitting layer 40 respectively from the cathode 30 and the anode 20 by applying a appropriate voltage to both the anode 20 and the cathode 30. Excitons are produced in the organic light-emitting layer 40 by recombination of these electrons and holes. Light with-an energy level specified by the defect section 300 (an organic light-emitting layer 40) is transmitted in the first grating 100 in the X directions, whereas no light is transmitted in the second grating 200 in the Y directions. Specifically, although the light with a spectrum range corresponding to the photonic band gap of the first grating 100 cannot be transmitted inside the first grating 100, the excitons produced in the organic light-emitting layer 40 are returned to the ground state at an energy level caused by the defect and only the light with a spectrum range corresponding to this energy level is emitted. Therefore, the light with a wavelength specified by the energy level caused by the defect is emitted preferentially to the directions in which the confinement of light is insufficient in the X directions. This light has a vary narrow emission spectrum width and high efficiency.

Light can be emitted also in the Y directions in the present embodiment by forming the organic light-emitting layer 40 to be a defect in the Y directions.

Particularly, due to the possession of an organic light-emitting layer the light-emitting device 1000 of this embodiment is less affected by the irregular state and impurities of the boundary areas of light-emitting layer than the light-emitting device using semiconductors, whereby more excellent characteristics from the photonic band gap can thus be obtained. This also applies to other embodiments.

As methods of manufacturing the gratings 100, 200 of the light-emitting device 1000 and the materials constituting each layer, the methods and materials described above can be appropriately used. A hole transport layer and an electron transport layer can be provided between the organic light-emitting layer and electrode, as required. These methods, materials, and structures also apply to the following embodiments.

Second Embodiment

Figure 2:
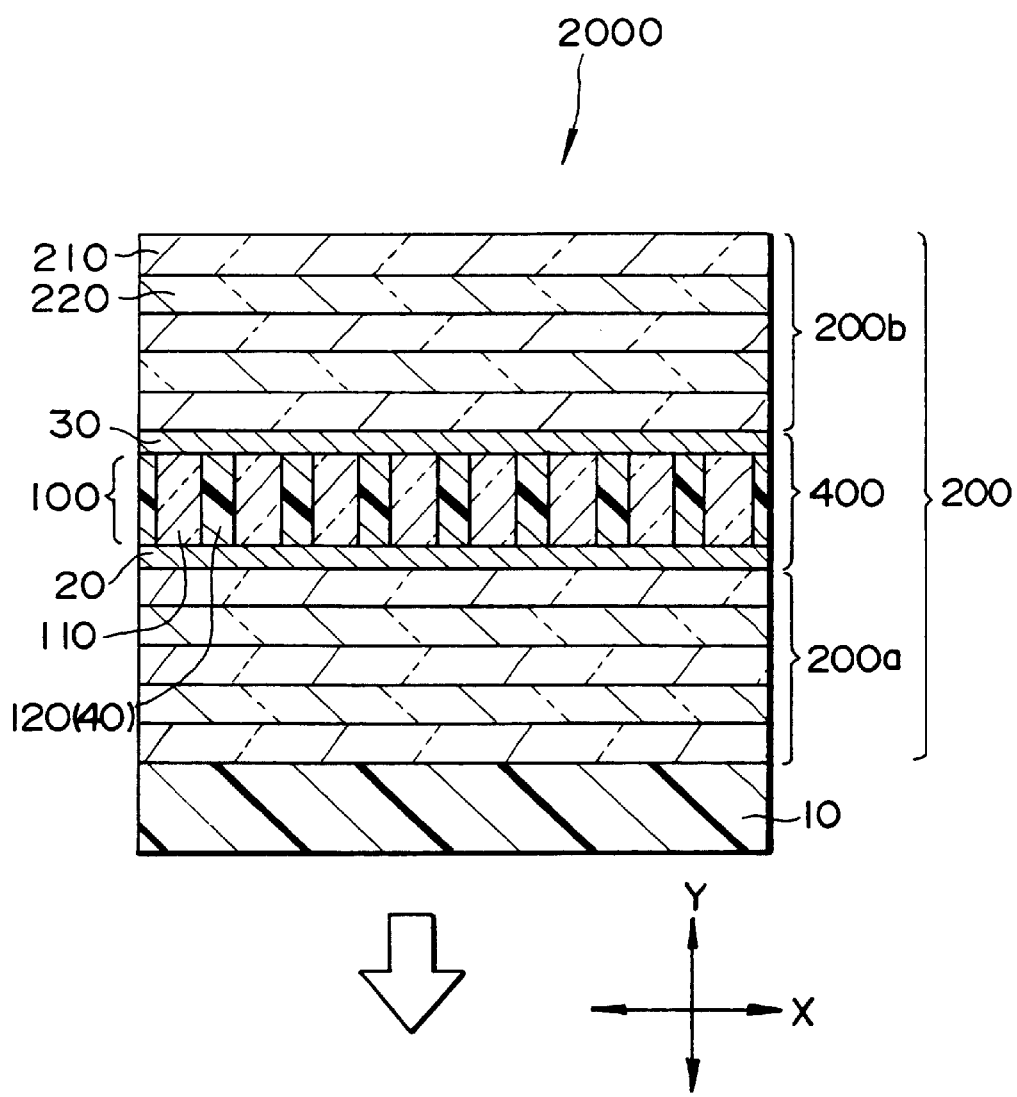
FIG. 2 is a cross-sectional view schematically showing a light-emitting device according to a second embodiment of the present invention.

FIG. 2 is a schematic cross-section of a light-emitting device 2000 of the present embodiment. The light-emitting device 2000 has a similar basic structure as the light-emitting device 1000 of the first embodiment, except for the constitution of the first grating 100 and the light emitting direction. The light-emitting device 2000 comprises a substrate 10, an anode 20, an organic light-emitting layer 40, a cathode 30, a first optical grating 100, and a second optical grating 200.

The first grating 100 has a periodic refractive index distribution in a first direction (X direction) and forms a photonic band gap to a designed spectrum range. The second grating 200 has a periodic refractive index distribution in the Y directions perpendicularly crossing the X directions, and forms a photonic band gap to a designed spectrum range. The first grating 100 is formed between the second gratings 200 in the periodical directions, so that the second gratings are continuously formed above and beneath the first grating 100.

A first grating 100 comprises alternately arranged first medium layers 110 and second medium layers 120 having different refractive indices. A second medium layer 120 is formed by an organic light-emitting layer 40. A second grating 200 comprises alternately arranged first medium layers 210 and second medium layer 220 having different refractive indices.

Any materials can be used as the first medium layer 110, the second medium layer 120, the first medium layer 210, and the second medium layer 220 without limitation, inasmuch as these materials can form a photonic band gap by the periodic refractive index distribution. For example, the first medium layer 110 of the first grating 100 may be a gas such as air. In the case of forming a grating with a so-called an air-gap structure by such a gaseous layer, the difference in the refractive indices of the two medium layers which constitute a grating can be increased while using materials commonly used for light-emitting devices.

An anode 20 is formed below the first grating 100, and a cathode 30 is formed above the first grating 100. The anode 20 and cathode 30 are optically transparent to the emitting light.

Specifically, the laminated layer 400 which is formed by the first grating 100, an anode 20, and a cathode 30 functions as defects for the second grating 200. The first grating 100 has an organic light-emitting layer 40 (a second medium layer 120) and functions also as a light-emitting layer. The defect section (laminated layer 400) is formed so that the energy level caused by the defect is within the emission spectrum from the organic light emitting layer 40 by the electrically pumping. In contrast, the photonic band gap of the first grating 100 is set so that there is no defect in the emission spectrum due to the electrically pumping of the organic light-emitting layer 40.

In this embodiment, the emitting light direction can be specified by providing a difference in the light confinement conditions between the two gratings which form the second grating, i.e. the grating 200a on the one side of the defect section (laminated layer 400) and the grating 200b on the other side of the defect section. For example, when it is desired to cause light emitted from the lower side of the defect section 400 shown in FIG. 2, this can be accomplished by making the light confinement conditions of one grating 200a weaker than the light confinement conditions of the other grating 200b. The sufficiency of light confinement conditions in the grating can be controlled by the number of pairs of the gratings, the difference in the refractive indices of medium layers which form the optical section, and the like means. If the light confinement conditions of both the gratings 200a and 200b are maintained almost equivalent, light with almost the same power can be emitted from the both sides of the second grating 200.

In the same manner as in the first embodiment, because the light is confined by the first grating 100 having a photonic band gap in the X directions and the second grating 200 having a photonic band gap in the Y directions, the light-emitting device 2000 can control light propagation in two-dimensions of the X and Y directions. Light with a leaky mode can be transmitted in other directions.

The action and effect of the light-emitting device 2000 will be described below.

Electrons and holes are injected into the organic light-emitting layer 40 respectively from the cathode 30 and the anode 20 by applying a appropriate voltage to both the anode 20 and the cathode 30. Excitons are produced in the organic light-emitting layer 40 by recombination of these electrons and holes. Light with an energy level caused by the defect section (laminating layer 400) is transmitted in the second grating 200 in the Y directions, whereas no light is transmitted in the first grating 100 in the X directions. Specifically, although the light with a spectrum range corresponding to the photonic band gap of the second grating 200 cannot be transmitted inside the second grating 200, the excitons produced by the defect section (laminating layer 400) are returned to the ground state at an energy level caused by the defect and only the light with a spectrum range corresponding to this energy level is emitted. Therefore, the light with a wavelength specified by the energy level caused by the defect is emitted preferentially to the directions in which the confinement of light is insufficient in the Y directions. This light has a vary narrow emission spectrum width and high efficiency.

Third Embodiment

Figure 3:
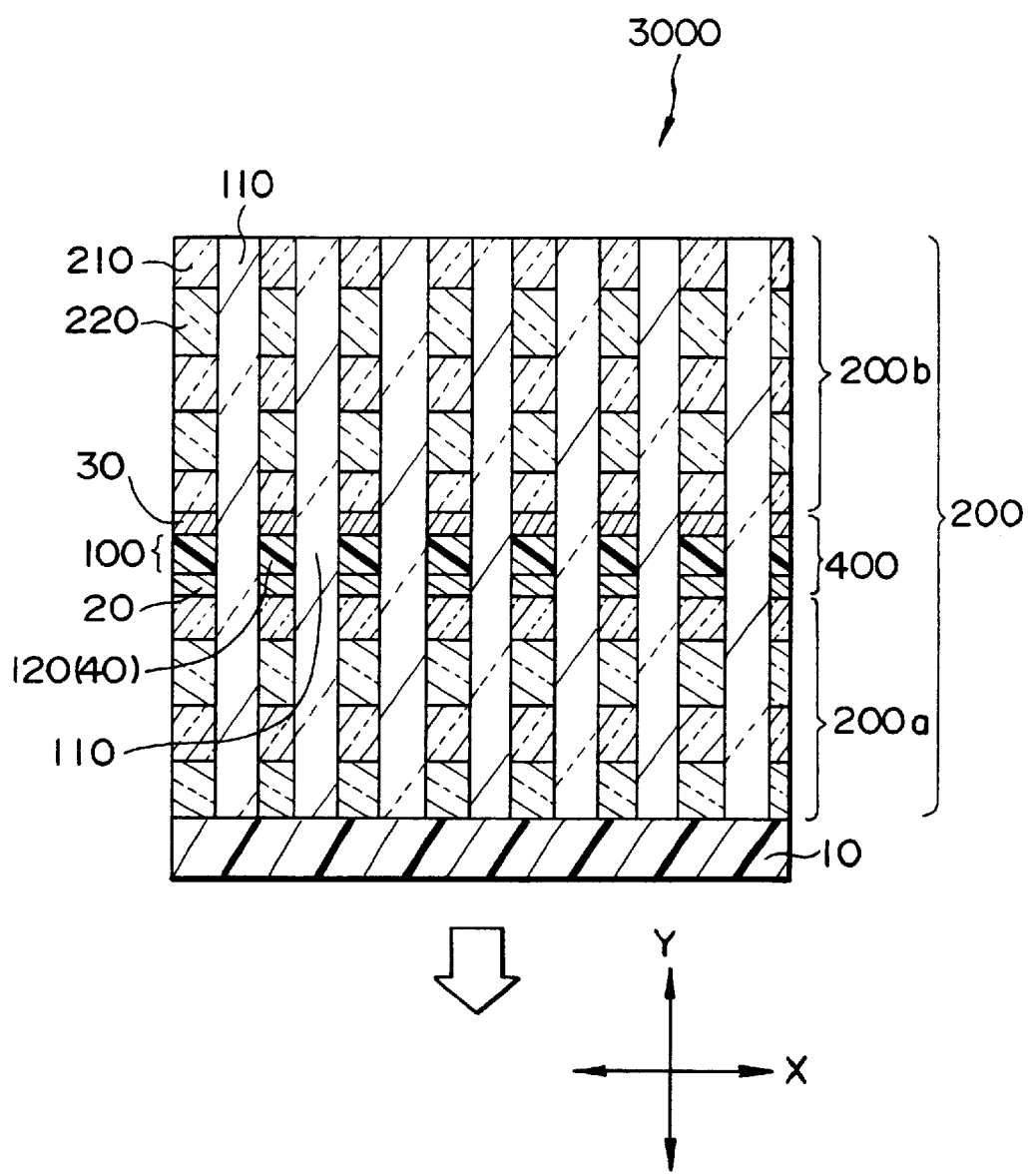
FIG. 3 is a cross-sectional view schematically showing a light-emitting device according to a third embodiment of the present invention.

FIG. 3 is a schematic cross-section of a light-emitting device 3000 according to the present embodiment. The light-emitting device 3000 comprises a substrate 10, an anode 20, an organic light-emitting layer 40, a cathode 30, a first optical section (grating) 100, and a second optical section (grating) 200.

The first grating 100 has a periodic refractive index distribution in a first direction (X direction) and forms a photonic band gap to a designed spectrum range. The second grating 200 has a periodic refractive index distribution in the Y directions perpendicularly crossing the X directions, and forms a photonic band gap to a designed spectrum range. The first grating 100 is formed between the second grating 200 in the periodical directions, so that the second grating are continuously formed above and beneath the first grating 100.

A first grating 100 comprises alternately arranged first medium layers 110 and second medium layers 120 having different refractive indices. A second medium layer 120 is formed by an organic light-emitting layer 40. The first medium layers 110 are formed continuously also in the periodic direction of the second grating 200. A second grating 200 comprises alternately arranged first medium layers 210 and second medium layer 220 having different refractive indices.

Any materials can be used as the first medium layer 110, the second medium layer 120, the first medium layer 210, and the second medium layer 220 without limitation, inasmuch as these materials can form a photonic band gap by the periodic refractive index distribution. For example, the first medium layer 110 of the first grating 100 may be a gas such as air. In the case of forming a grating with a so-called an air-gap structure by such a gaseous layer, the difference in the refractive indices of the two medium layers which constitute a grating can be increased while using materials commonly used for light-emitting devices. In addition, either the first medium layer 210 or the second medium layer 220 of the second grating 200 may be made from the same material as the material of the first medium layer 110 of the first grating 100.

An anode 20 is formed below the second medium layer 120 (an organic light-emitting layer 40) of the first grating 100, and a cathode 30 is formed above the second medium layer 120. The anode 20 and cathode 30 are optically transparent to the emitting light.

Specifically, the laminated layer 400 which is formed by the second medium layer 120 of the first grating 100, the anode 20, and the cathode 30 function as defects for the second grating 200. The laminated layer 400 has an organic light-emitting layer 40 (a second medium layer 120) of the first grating 100 and functions also as a light-emitting layer. The defect section (laminated layer 400) is formed so that the energy level caused by the defect is within the emission spectrum from the organic light emitting layer 40 by the electrically pumping. In contrast, the photonic band gap of the first grating 100 is set so that there is no defect in the emission spectrum due to the electrically pumping of the organic light-emitting layer 40.

In this embodiment, the emitting light direction can be specified by providing a difference in the light confinement conditions between the two gratings which form the second grating, i.e. the grating 200a on the one side of the defect section (laminated layer 400) and the grating 200b on the other side of the defect section. For example, when it is desired to cause light emitted from the lower side of the defect section 400 shown in FIG. 2, this can be accomplished by making the light confinement conditions of one grating 200a weaker than the light confinement conditions of the other grating 200b. The sufficiency of light confinement conditions in the grating can be controlled by the number of pairs of the gratings, the difference in the refractive indices of medium layers which form the gratings, and the like means. If the light confinement conditions of both the gratings 200a and 200b are maintained almost equivalent, light with almost the same power can be emitted from the both sides of the second grating 200.

In the same manner as in the first embodiment, because the light is confined by the first grating 100 having a photonic band gap in the X directions and the second grating 200 having a photonic band gap in the Y directions, the light-emitting device 3000 can control light propagation in two-dimensions or X and Y directions. Light with a leaky mode can be transmitted in other directions.

The action and effect of the light-emitting device 3000 will be described below.

Electrons and holes are injected into the organic light-emitting layer 40 respectively from the cathode 30 and the anode 20 by applying a appropriate voltage to both the anode 20 and the cathode 30. Excitons are produced in the organic light-emitting layer 40 by recombination of these electrons and holes. Light with an energy level caused by the defect section (laminating layer 400) is transmitted in the second grating 200 in the Y directions, whereas no light is transmitted in the first grating 100 in the X directions. Specifically, although the light with a spectrum range corresponding to the photonic band gap of the second grating 200 cannot be transmitted inside the second grating 200, the excitons produced by the defect section (laminating layer 400) are returned to the ground state at an energy level caused by the defect and only the light with a spectrum range corresponding to this energy level is emitted. Therefore, the light with a wavelength specified by the energy level caused by the defect is emitted preferentially to the directions in which the confinement of light is insufficient in the Y directions. This light has a vary narrow emission spectrum width and high efficiency.

In this embodiment, after piling the medium layer which form the gratings 100 and 200 (including an organic light-emitting layer), an anode 20, a cathode 30, and the like on the substrate 10, grooves are formed perpendicularly on the substrate 10. The light-emitting device can be fabricated comparatively easily by embedding the first medium layer 110 in the grooves or by utilizing the grooves for air gaps.

Fourth Embodiment

Figure 4:
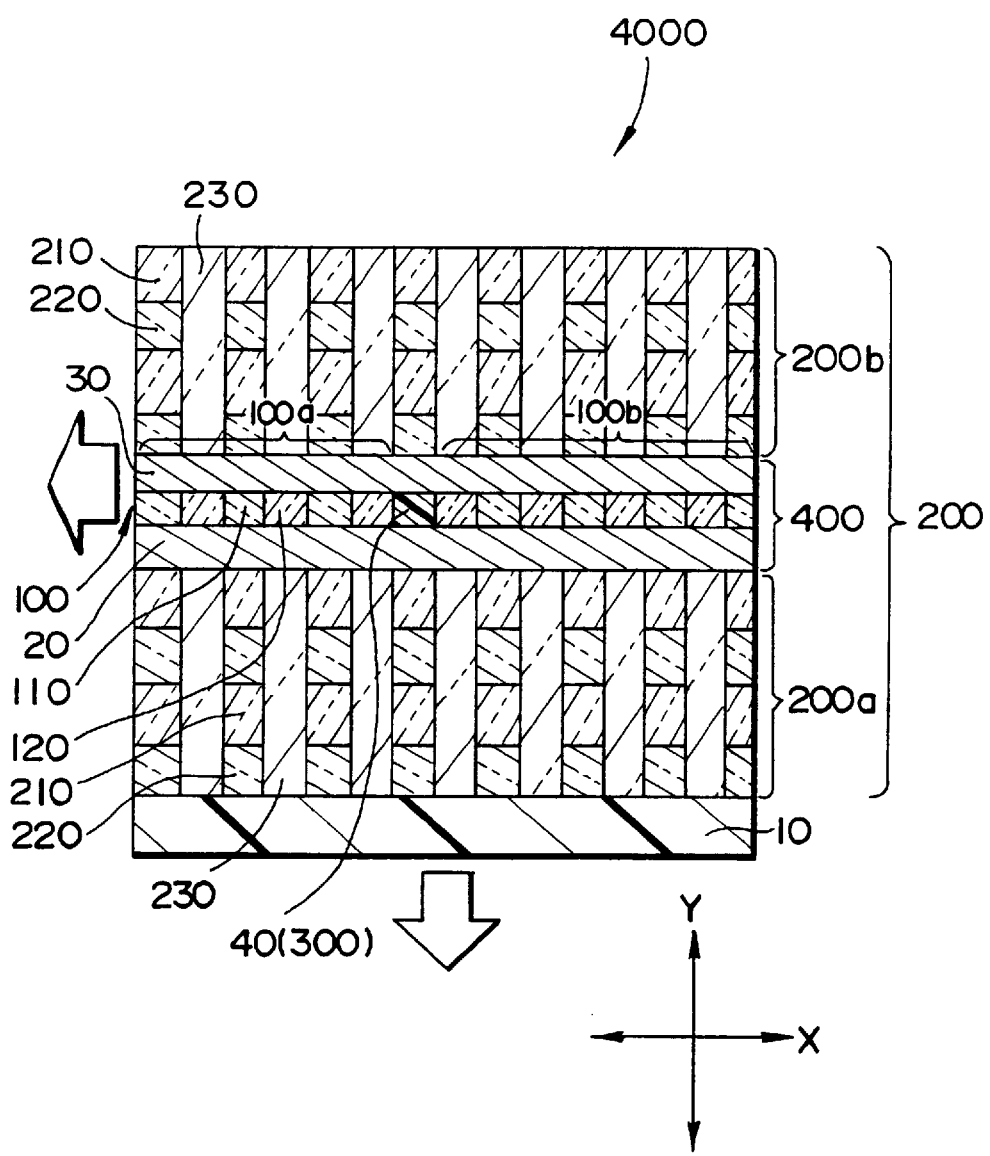
FIG. 4 is a cross-sectional view schematically showing a light-emitting device according to a fourth embodiment of the present invention.

FIG. 4 is a schematic cross-section of a light-emitting device 4000 according to the present embodiment. The light-emitting device 4000 comprises a substrate 10, an anode 20, an organic light-emitting layer 40, a cathode 60, a first optical section (grating) 100, and a second optical section (grating) 200.

The first grating 100 has a periodic refractive index distribution in a first direction (X direction) and forms a photonic band gap to a designed spectrum range. The second grating 200 has a periodic refractive index distribution in the Y directions perpendicularly crossing the X directions, and forms a photonic band gap to a designed spectrum range. The first grating 100 is formed between the second gratings 200 in the periodical directions, so that the second gratings are continuously formed above and beneath the first grating 100.

A first grating 100 comprises alternately arranged first medium layers 110 and second medium layers 120 having different refractive indices. One of the first medium layers 110 is formed by the organic light-emitting layer 40. A second grating 200 comprises alternately arranged first medium layers 210 and second medium layer 220 having different refractive indices. The third medium layer 230 is formed continuously in the periodical directions of the second grating 200.

Any materials can be used as the first medium layer 110, the second medium layer 120, the first medium layer 210, and the second medium layer 220 without limitation, inasmuch as these materials can form a photonic band gap by the periodic refractive index distribution. For example, the second medium layer 120 of the first grating 100 and the third medium layer 230 of the second grating 200 may be a gas such as air. In the case of forming a grating with a so-called an air-gap structure by such a gaseous layer, the difference in the refractive indices of the two medium layers which constitute a grating can be increased while using materials commonly used for light-emitting devices. In addition, either the first medium layer 210 or the second medium layer 220 of the second grating 200 may be made from the same material as the material of the third medium layer 230. Furthermore, the third medium layer 230 may be formed from the same material as the material of the second medium layer 120 of the first grating 100.

An anode 20 is formed below the first grating 100, and a cathode 30 is formed above the first grating 100. The anode 20 and cathode 30 are optically transparent to the emitting light.

The organic light-emitting layer 40 functions as a defect section 300 of the first grating 100. In addition, the laminated layer 400 which is formed by the first grating 100, an anode 20, and a cathode 30 functions as defects for the second grating 200. The laminated layer 400 has an organic light-emitting layer 40 of the first grating 100 and functions also as a light-emitting layer. The photonic band gap of the first grating 100 is set so as to be present within the emission spectrum produced by the electrically pumping of the organic light-emitting layer 40. In addition, the defect section (laminated layer 400) is formed so that the energy level caused by the defect is within the emission spectrum of the electrically pumping caused by the organic light-emitting layer 40.

In this embodiment, light can be emitted from both the first grating 100 and the second grating 200. The direction of the light from the first grating 100 can be specified, for instance, by providing different light confinement conditions between the grating 100a on the one side of the defect section 300 and the grating 100b on the other side of the defect section 300 which constitute the first grating 100. For example, when it is desired to cause light emitted from the left side of the defect section 300 shown in FIG. 4, this can be accomplished by making the light confinement conditions of one grating 100a weaker than the light confinement conditions of the other grating 100b. In addition, the emitting light direction can be specified by providing a difference in the light confinement conditions between the two gratings which form the second grating, i.e. the grating 200a on the one side of the defect section (laminated layer 400) and the grating 200b on the other side of the defect section. For example, when it is desired to cause light emitted from the lower side of the defect section 400 shown in FIG. 4, this can be accomplished by making the light confinement conditions of one grating 200a weaker than the light confinement conditions of the other grating 200b. The sufficiency of light confinement conditions in the gratings can be controlled by the number of pairs of the gratings, the difference in the refractive indices of medium layers which form the gratings, and the like means.

If the light confinement conditions of all of gratings 100a, 100b, 200a, and 200b, are maintained almost equivalent, light with almost the same power can be emitted from the both sides (four directions) of the first and second gratings 100, 200. Of course, it is possible to cause light emitted from either the X direction or Y direction by specifying the relation between the energy level caused by the defect and the photonic band gap.

In the same manner as in the first embodiment, because the light is confined by the first grating 100 having a photonic band gap in the X direction and the second grating 200 having a photonic band gap in the Y direction, the light-emitting device 4000 can control light propagation in two-dimensions of X and Y directions. Light with a leaky mode can be transmitted in other directions.

The action and effect of the light-emitting device 4000 will be described below.

Electrons and holes are injected into the organic light-emitting layer 40 respectively from the cathode 30 and the anode 20 by applying a appropriate voltage to both the anode 20 and the cathode 30. Excitons are formed in the organic light-emitting layer 40 by recombination of these electrons and holes. Light with an energy level caused by the defect (laminating layer 400) is transmitted in the second grating 200 in the Y direction. Light is transmitted also in the first grating 100 in the X direction. Specifically, although the light with a spectrum range corresponding to the photonic band gap of the first and second gratings 100, 200 cannot be transmitted inside these gratings, the excitons produced in the organic light-emitting layer 40 of the defect section (300 and laminating layer 400) are returned to the ground state at an energy level caused by the defect and only the light with a spectrum range corresponding to this energy level is emitted. Therefore, light with the wavelength specified by the energy level caused by the defect is preferentially emitted in the directions in which light confinement conditions are weak among the X and Y directions. This light has a vary narrow emission spectrum width and high efficiency.

In this embodiment, after piling the medium layers 210, 220 which form the second grating 200 on the substrate 10, grooves are formed perpendicularly on the substrate 10. The second grating 200a on the lower side can be fabricated by embedding the medium layer 230 in the grooves. Then, the grating 100 is formed by piling an anode 20, medium layers 110 and 120 (including an organic light-emitting layer 40) which form the grating 100, and a cathode 30. Then, the upper side grating 200b is formed in the same manner as in the lower side grating 200a, whereby the light-emitting device can be fabricated comparatively easily. When there is an air gap, the light emitting device can be formed utilizing the above-mentioned groove.

Fifth Embodiment

Figure 5:
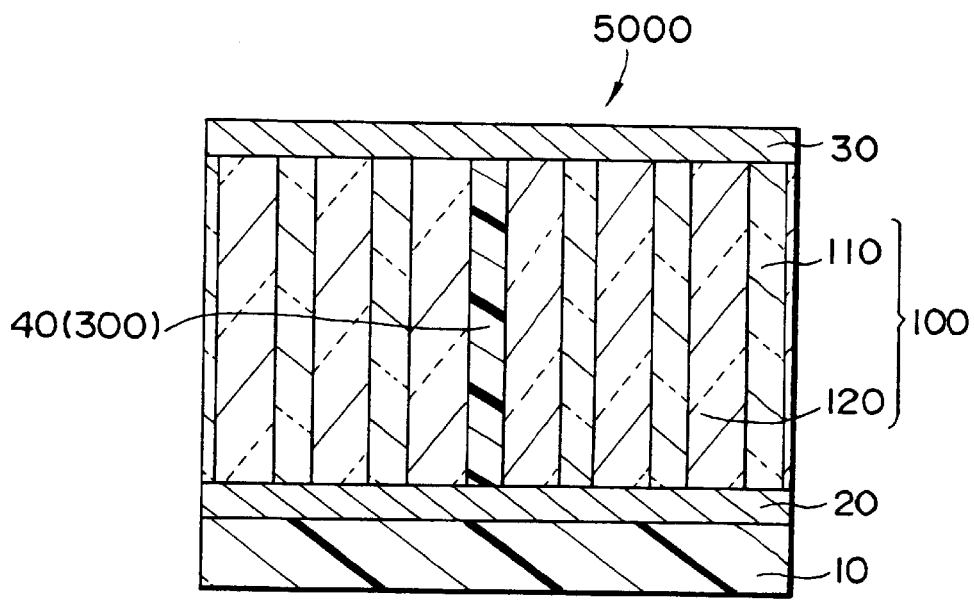
FIG. 5 is a cross-sectional view schematically showing a light-emitting device according to a fifth embodiment of the present invention.
Figure 6:
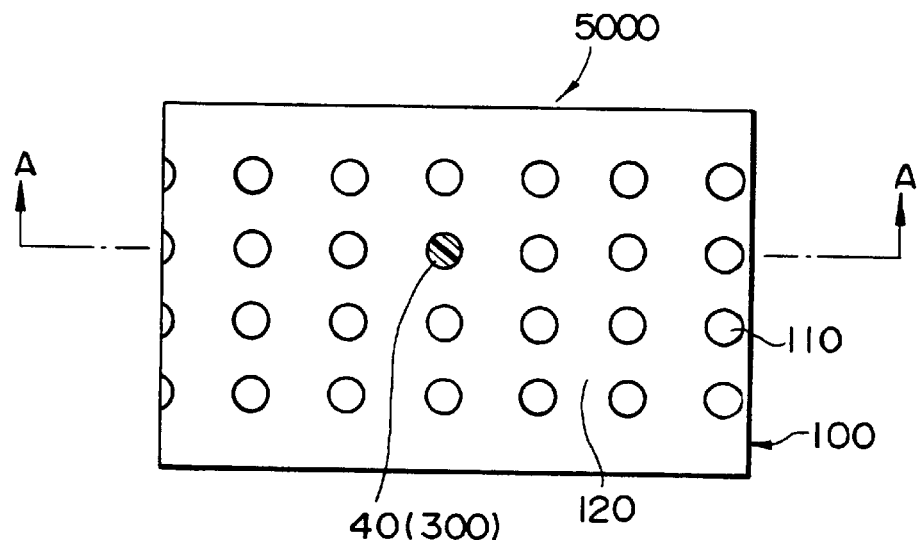
FIG. 6 is a plan view schematically showing the light-emitting device shown in FIG. 5.

FIG. 5 is a schematic cross-section of a light-emitting device 5000 according to the present embodiment, and FIG. 6 is a plan view of the light-emitting device of FIG. 5, but excluding the cathode 30. The light-emitting device 5000 comprises a substrate 10, an anode 20, an organic light-emitting layer 40, a cathode 30, and an optical section 100.

The optical section 100 is formed by first medium layers 110 which comprise columns formed on the substrate 10 in a designed pattern and second medium layers 120 filling out the spaces among the columns (first medium layer 110) in the first medium and made from a material with a refractive index different from the refractive index of the first medium layers 110. The first medium layer 110 has a square lattice pattern. Therefore, the optical section 100 has a periodic refractive index distribution in a first direction (X direction) and forms a photonic band gap to a designed spectrum range. At the same time, the optical section 100 has a periodic refractive index distribution in the Y direction which is perpendicular to the X direction and forms a photonic band gap to a designed spectrum range.

In the present embodiment, it is possible to form a two-dimensional photonic band gap by forming a periodic refractive index distribution in the direction with an angle of 45° to the X and Y directions of FIG. 6 by means of suitable selection of the refractive indices for the medium layers 110 and 120, appropriate adjustment of dimensions (pitches), and the like.

The materials for the first medium layer 110 and the second medium layer 120 are not specifically limited insofar as these two layers can form a photonic band gap by the periodic refractive index distribution. For example, either the first medium layer 110 or the second medium layer 120 of the optical section 100 may be a gas such as air. When the optical section is formed using a gaseous layer to produce a commonly-called air-gap structure member, the difference in the refractive indices of the two medium layers forming the optical section can be enlarged with the material selection commonly used for light-emitting devices.

An anode 20 is formed below the optical section 100 and a cathode 30 is formed above the optical section 100.

One of the first medium layers forming the optical section 100 is formed by an organic light-emitting layer 40, and a defect section 300 is formed by the organic light-emitting layer 40. The defect section 300 is formed so that the energy level caused by the defect is within the emission spectrum of the electrically pumping caused by the organic light-emitting layer 40. The emitting light directions can be specified by specifying the location, configuration, and the like of the defect section 300. Specifically, in the case where light is caused to be emitted from one direction, the photonic band gap of the optical section 100 is set so that there is no defect in the emission spectrum due to the electrically pumping of the organic light-emitting layer 40 in either the X direction or the Y direction. In addition, it is possible to cause the light emitted from both the X direction and Y direction according to the location and configuration of the defect section 300.

In the light-emitting device 5000 of this embodiment, optical propagation is controlled two-dimensionally in the X and Y directions by the optical section 100 having square lattices. Light with a leaky mode can be transmitted in other directions.

The action and effect of the light-emitting device 5000 will now be described.

Electrons and holes are injected into the organic light-emitting layer 40 respectively from the cathode 30 and the anode 20 by applying a appropriate voltage to both the anode 20 and the cathode 30. Excitons are formed in the organic light-emitting layer 40 by recombination of these electrons and holes. In the optical section 100, light with an energy level caused by the defect of the defect section 300 (organic light-emitting layer 40) is transmitted at least one of the X direction and Y direction, but no light is transmitted to other directions. Specifically, although the light with a spectrum range corresponding to the photonic band gap of the optical section 100 cannot be transmitted inside the optical section 100, the excitons produced in the organic light-emitting layer 40 of the defect section 300 are returned to the ground state at an energy level caused by the defect and only the light with a spectrum range corresponding to this energy level is emitted. Therefore, the light with a wavelength specified by the energy level caused by the vacancies is emitted to the directions in which the confinement of light is insufficient in the X or Y directions. This light has a vary narrow emission spectrum width and high efficiency.

In this embodiment, the optical section 100 can be fabricated by forming an anode 20 on a substrate 10, forming first medium layers (column) 110, and piling second medium layers 120 among the first medium layers 110. When the second medium layers 120 are air gaps, the light-emitting device can be formed by filling out no materials in the gaps for the second medium layers 120.

<Embodiment for Modified Optical Section>

The structures for optical sections shown in FIG. 7, FIG. 8, and FIGS. 13A to 13C can be adopted for the optical section in the fifth embodiment. When the parts and sections in these figures are the same as those shown in FIGS. 5 and 6, the same symbols as in the FIGS. 5 and 6 are given and detailed descriptions for these parts and sections are omitted.

Figure 7:
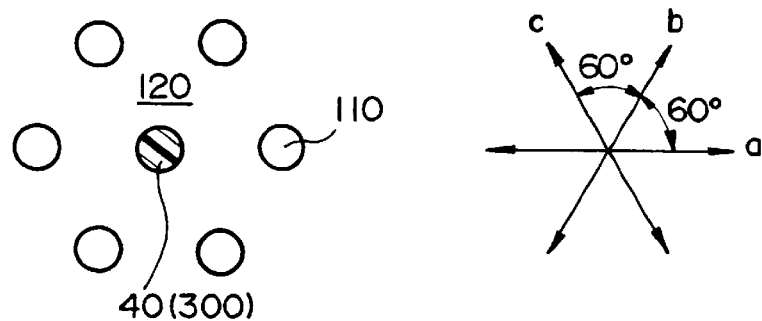
FIG. 7 is a schematic view of a modification of the light-emitting device of the fifth embodiment of the present invention.

(A) FIG. 7 shows an example in which an optical section in the shape of triangle lattices is formed. Because light propagation is inhibited two-dimensionally in three directions (a, b, and c directions) in this optical section, the light confinement is more perfect than the case of two directions (X and Y directions) confinement, resulting in higher efficiency of light emission.

Figure 8:
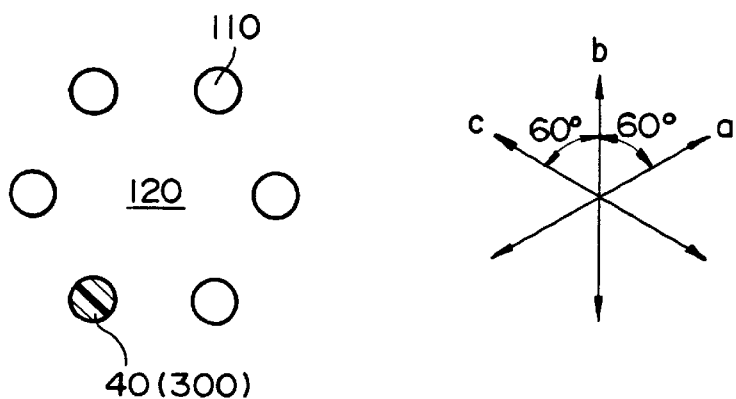
FIG. 8 is a schematic view of a modification of the light-emitting device of the fifth embodiment of the present invention.

(B) FIG. 8 shows an example in which an optical section in the shape of honey-comb lattice is formed. Because light propagation is inhibited two-dimensionally in three directions (a, b, and c directions) in also this optical section, the light confinement is more perfect than the case of two directions (X and Y directions) confinement, resulting in higher efficiency of light emission. Particularly, in the case of the honey-comb lattice optical section shown in FIG. 8, light can be confined as any arbitrary polarized waves.

Figure 13A:
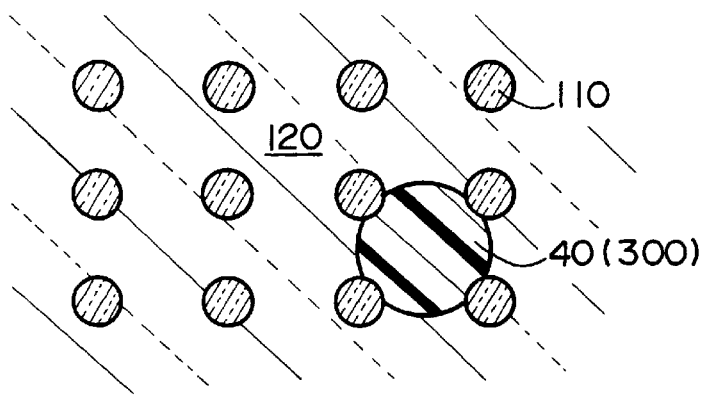
FIGS. 13A to 13C are schematic views of modifications of the light-emitting device of the fifth embodiment of the present invention.
Figure 13B:
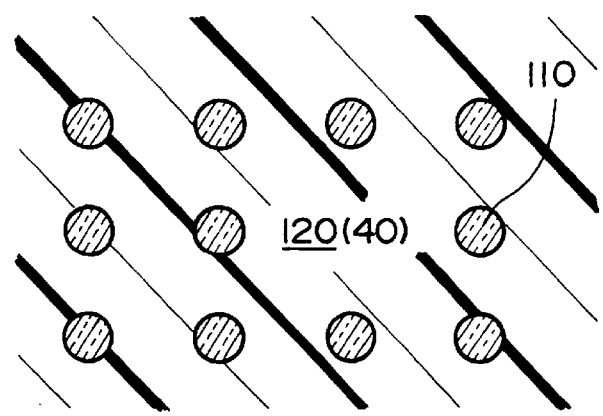
Figure 13C:
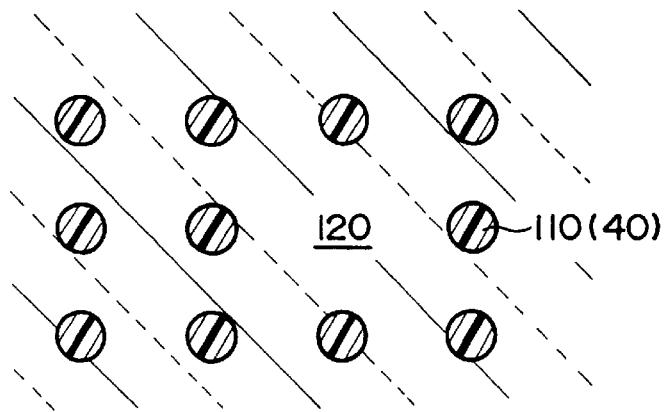

(C) FIG. 13A to FIG. 13C show other examples in which the optical section is formed in the shape of square lattices. The optical section shown in FIG. 13A has a defect section 300 formed by an organic light-emitting layer 40, and the defect section 400 is formed as part of the second medium layer 120. The optical section shown in FIG. 13B has a structure wherein an organic light-emitting layer 40 is used as a second medium layer 120. Defects in this example are formed by making part of a first medium layer 110 irregular, for example without forming part of the first layer 110. The optical section shown in FIG. 13C has defects formed by making part of the first medium layer 110 irregular, for example without forming part of the first layer 110. In addition, the first medium layer 110 in this example is formed by the organic light-emitting layer 40.

Sixth Embodiment

Figure 9:
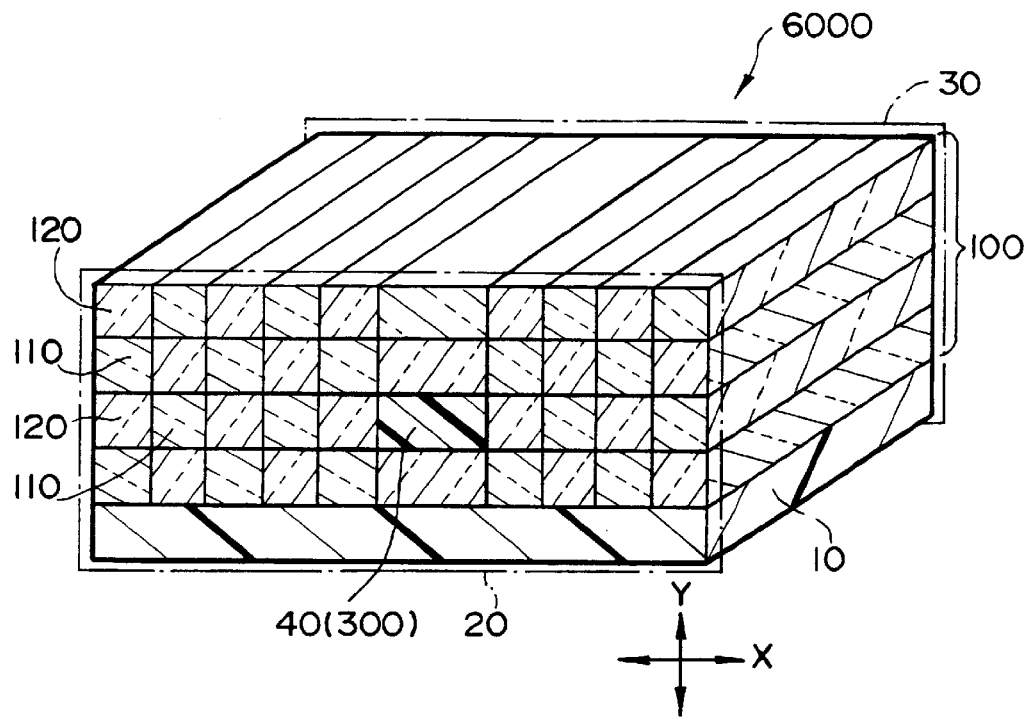
FIG. 9 is a schematic oblique view of the light-emitting device according to the sixth embodiment of the present invention.

FIG. 9 is an oblique view having a cross-section schematically showing a light-emitting device 6000 of the present embodiment. The light-emitting device 6000 comprises a substrate 10, an anode 20, an organic light-emitting layer 40, a cathode 30, and an optical section 100. The optical section 100 of this embodiment is similar to that of the fifth embodiment in that the member has a square lattice configuration, but the direction of grating versus the substrate 10 differs from that of the fifth embodiment.

The optical section 100 is formed of first medium layers 110 which comprise posts (square shape) formed on the plane perpendicular to the substrate 10 in a designed pattern and second medium layers 120 filling out the spaces among the columns (first medium layer 110) in the first medium and formed of a material with a refractive index different from the refractive index of the first medium layers 110. The first medium layers 110 and second medium layers 120 exhibit a mosaic configuration in the plane perpendicular to the substrate 10. Therefore, the optical section 100 has a periodic refractive index distribution in a first direction (X direction) and forms a photonic band gap to a predetermined spectrum range. At the same time, the optical section 100 has a periodic refractive index distribution in the Y direction which is perpendicular to the X direction and forms a photonic band gap to a predetermined spectrum range.

The materials for the first medium layer 110 and the second medium layer 120 are not specifically limited insofar as these two layers can form a photonic band gap by the periodic refractive index distribution.

An anode 20 is formed in front of the optical section 100 (the front plane standing perpendicularly to the substrate 10 in FIG. 9) and a cathode 30 is formed on the back of the optical section 100 (the rear plane standing perpendicularly to the substrate 10 in FIG. 9).

One of the first medium layers forming the optical section 100 is formed by an organic light-emitting layer 40, and a defect section 300 is formed by the organic light-emitting layer 40. The defect section 300 is formed so that the energy level caused by the defect is within the emission spectrum of the electrically pumping caused by the organic light-emitting layer 40. The emitting light directions can be specified by specifying the location, configuration, and the like of the defect section 300. Specifically, the photonic band gap of the optical section 100 is set so that there is no defect in the emission spectrum due to the electrically pumping of the organic light-emitting layer 40 in either the X direction or the Y direction. In addition, it is possible for the optical section 100 to cause the light emitted from both the X direction and Y direction according to the location and configuration of the defect section 300.

In the light-emitting device 6000 of this embodiment, optical propagation is controlled two-dimensionally in the X and Y directions by the optical section 100 having square lattices. Light with a leaky mode can be transmitted in other directions.

The action and effect of the light-emitting device 6000 will now be described.

Electrons and holes are injected into the organic light-emitting layer 40 respectively from the cathode 30 and the anode 20 by applying a appropriate voltage to both the anode 20 and the cathode 30. Excitons are formed in the organic light-emitting layer 40 by recombination of these electrons and holes. Light with an energy level caused by the defect section 300 (an organic light-emitting layer 40) is transmitted in either one of the X direction and Y direction, whereas no light is transmitted in the other direction. Specifically, although the light with a spectrum range corresponding to the photonic band gap of the optical section 100 cannot be transmitted inside the optical section 100, the excitons produced in the organic light-emitting layer 40 of the defect section 300 are returned to the ground state at an energy level caused by the defect and only the light with a spectrum range corresponding to this energy level is emitted. Therefore, the light with a wavelength specified by the energy level caused by the vacancies is emitted to the directions in which an energy level exists and the confinement of light is insufficient in the X or Y directions. This light has a vary narrow emission spectrum width and high efficiency.

In this embodiment, the optical section 100 is formed by successive two types of medium layers. In the first type, a first medium layer 110 and a second medium layer 120 are alternately formed on the substrate 10. In the second type, the second medium layer 120 is formed on the first medium layer of the first type, and the first medium layer 110 is formed on the second medium layer of the first type. A medium layer with a mosaic configuration can be formed on the X-Y plane by repeatedly forming the first-type medium layer and second-type medium layer. A defect section 300 (an organic light-emitting layer 40) is formed when forming either of the medium layers.

<Embodiment for Modified Optical Section>

Figure 10:
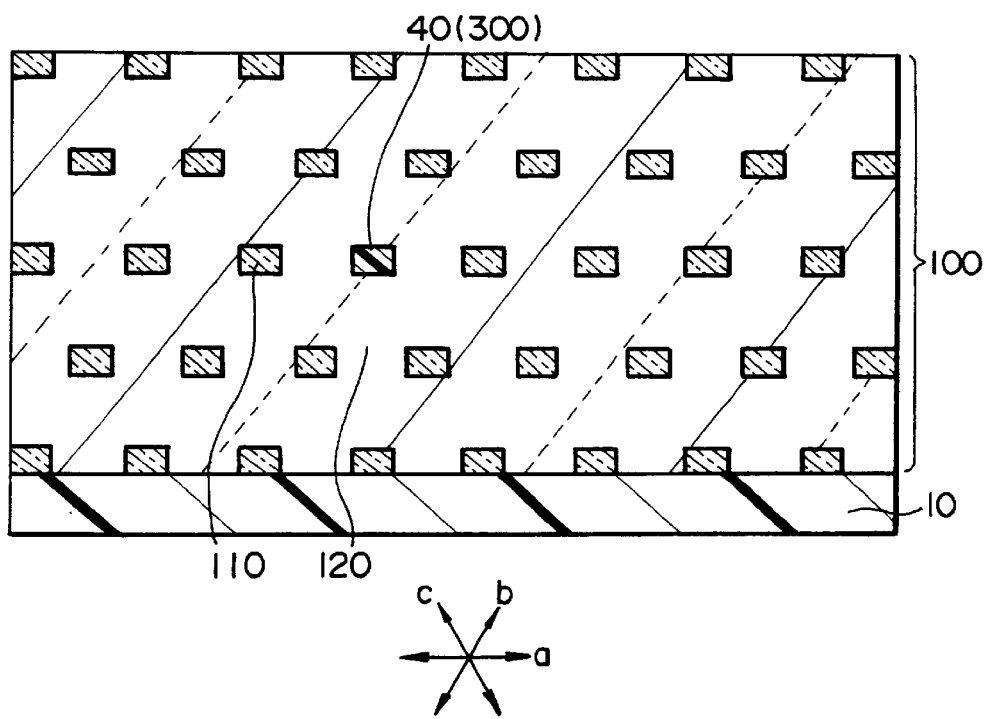
FIG. 10 is a schematic view of a modification of the light-emitting device of the sixth embodiment of the present invention.
Figure 11:
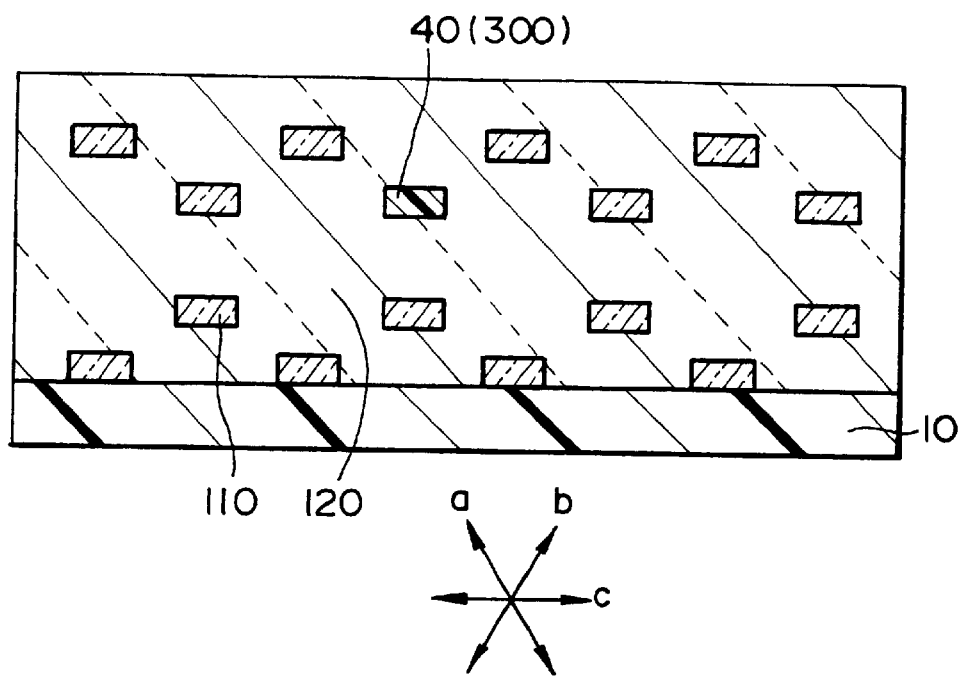
FIG. 11 is a schematic view of a modification of the light-emitting device of the sixth embodiment of the present invention.

FIGS. 10 and 11 show modifications of the optical section of the sixth embodiment. When the parts and sections in these figures are the same as those shown in FIG. 9, the same symbols as in the FIG. 9 are given and detailed descriptions for these parts and sections are omitted. FIG. 10 shows an example in which an optical section in the shape of triangle lattices is formed. FIG. 11 shows an example in which an optical section in the shape of honey-comb lattice is formed. Because light propagation is inhibited two-dimensionally in three directions (a, b, and c directions) in either of these cases, the light confinement is more perfect than the case of two directions (X and Y directions) confinement, resulting in higher efficiency of light emission. Particularly, in the case of the honey-comb lattice optical section shown in FIG. 11, light can be confined as any arbitrary polarized waves.

Seventh Embodiment

Figure 12:
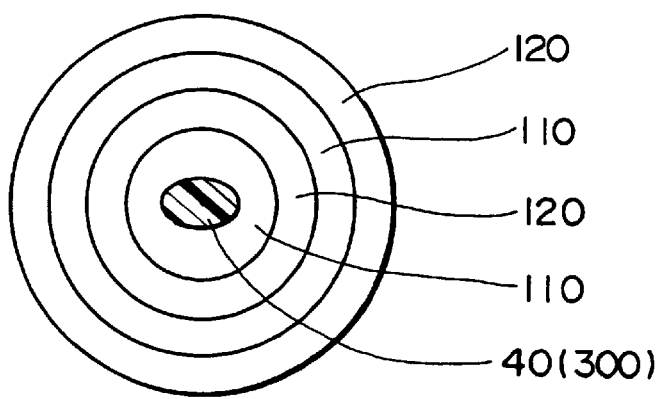
FIG. 12 is a schematic view of a modification of the light-emitting device of the seventh embodiment of the present invention.

FIG. 12 is a schematic plan view of the light-emitting device of this embodiment. In this light-emitting device, an organic light-emitting layer 40 which constitutes a defect section 300 is placed in the center, and a first medium layer 110 and a second medium layer 120 are alternately arranged concentrically around the organic light-emitting layer 40. This structure of the light-emitting device inhibits propagation of light in all two-dimensional directions and ensures strong confinement of light. Although the organic light-emitting layer 40 constituting the defect section 300 has an oval plane configuration in this example, the configuration is not necessarily limited to this. Any other configuration is acceptable insofar as the organic light-emitting layer 40 functions as defects. It is possible to cause light emitted at least from one direction also using the light-emitting device of this structure by appropriately specifying the arrangement, configuration, and the like of the organic light-emitting layer and medium layer.

In addition, it is possible to form the optical section having a concentric refractive index distribution shown in FIG. 12 so that the plane with different medium layers concentrically arranged is caused to stand perpendicularly to the substrate.

As illustrated in detail in the above description, a high performance light-emitting device with a very narrow emission spectrum width having characteristics as a two-dimensional photonic band gap by the use of an organic light-emitting layer can be provided by the present invention. The present invention is not limited to the above-described embodiments and many modifications and variations are possible within the scope of the present invention.

What is claimed is:

1. A light-emitting device comprising:
    an optical section of medium layers including an organic light-emitting layer, the optical section having a two-dimensional periodical refractive index distribution and capable of forming a photonic band gas,
    a defect section being formed by the organic light-emitting layer in part of the optical section to emit light of an energy level within a prescribed emission spectrum.

2. The light-emitting device according to claim 1,
    wherein the organic light-emitting layer also functions as one type of medium layer of the optical section.

3. The light-emitting device according to claim 1,
    wherein the organic light-emitting layer is made from a material which is capable of emitting light by electrically pumping, and the light-emitting device further comprises a pair of electrode layers which apply an electric field to the organic light-emitting layer.

4. A light-emitting device comprising:
    a first optical section of medium layers having a periodical refractive index distribution in a first direction and being capable of forming a photonic band gap;
    a second optical section of medium layers having a periodical refractive index distribution in a second direction which is perpendicular to a first direction, the second optical section being capable of forming a photonic band gap; and
    an organic light-emitting layer formed in at least one of the first and second optical sections, a defect section being formed by the organic light-emitting layer in at least one of the first and second optical sections to emit light of an energy level within a prescribed emission spectrum.

5. The light-emitting device according to claim 4,
    wherein the organic light-emitting layer also functions as one type of medium layer of the optical section.

6. The light-emitting device according to claim 4, wherein:
    the first optical section forms part of the second optical section, the defect section is formed by an organic light-emitting layer formed in the first optical section, and light is emitted in the periodic direction of the first optical section.

7. The light-emitting device according to claim 4, wherein:

the first optical section forms part of the second optical section, one type of medium layer forming the first optical section is formed by an organic light-emitting layer, the defect section comprises the first optical section, and light is emitted in the periodic direction of the second optical section.

8. The light-emitting device according to claim 4, wherein:

the first optical section forms part of the second optical section, one type of medium layer forming the first optical section is formed by an organic light-emitting layer, another medium layer in the first optical section is formed continuously to the second optical section in the periodic direction of the second optical section, the defect section comprises the first optical section, and light is emitted in the periodic direction of the second optical section.

9. The light-emitting device according to claim 4, wherein:

the first optical section forms part of the second optical section, the defect section is formed in at least one of the first optical section and the second optical section, and light is emitted in the periodic direction of at least one of the first optical section and the second optical section.

10. The light-emitting device according to claim 9, wherein:

the defect section are formed in the first and second optical sections, the defect section formed in the first optical section is formed by an organic light-emitting layer, the defect section formed in the second optical section comprises the first optical section, and light is emitted in the periodic directions of both the first optical section and the second optical section.

11. The light-emitting device according to claim 4, wherein the organic light-emitting layer is made from a material which is capable of emitting light by electrically pumping, and the light-emitting device further comprises a pair of electrode layers which apply an electric field to the organic light-emitting layer.

* * * * *